United States Patent [19]
Plumton et al.

[11] Patent Number: 4,743,569
[45] Date of Patent: May 10, 1988

[54] TWO STEP RAPID THERMAL ANNEAL OF IMPLANTED COMPOUND SEMICONDUCTOR

[75] Inventors: Donald L. Plumton, Dallas; Liem T. Tran, Garland; Walter M. Duncan, Dallas, all of Tex.

[73] Assignee: Texas Instruments Incorporated, Dallas, Tex.

[21] Appl. No.: 40,420

[22] Filed: Apr. 20, 1987

[51] Int. Cl.$^4$ .......................... H01L 21/265
[52] U.S. Cl. .............. 437/247; 148/DIG. 4; 148/DIG. 94; 437/22; 437/942
[58] Field of Search .......................... 437/22, 247, 942

[56] References Cited

U.S. PATENT DOCUMENTS

| | | | |
|---|---|---|---|
| 4,331,485 | 5/1982 | Gat | 437/942 |
| 4,350,537 | 9/1982 | Young et al. | 437/942 |
| 4,544,417 | 10/1985 | Clarke et al. | 437/942 |
| 4,555,273 | 11/1985 | Collins et al. | 437/22 |
| 4,576,652 | 3/1986 | Hovel et al. | 437/22 |

OTHER PUBLICATIONS

Pearton et al, Jour. Appl. Phys., 58 (Oct. 1985) 3252.
Chambon et al, Appl. Phys. Letts., 46 (1985) 162.
Patel et al, Radiation Effects, 91 (1985) 53.
Kuzuhara et al, Jour. Appl. Phys., 54 (1983) 3121.
Kuzuhara et al, Appl. Phys. Lett., 41 (1982) 755.
Feygenson et al, Thin Solid Films, 118 (1984) 103.
Lunnon et al, Appl. Phys. Lett., 46 (1985) 35.

Primary Examiner—Upendra Roy
Attorney, Agent, or Firm—Carlton H. Hoel; Leo N. Heiting; Melvin Sharp

[57] ABSTRACT

A two step rapid thermal anneal (RTA) has been studied for activating Be implanted GaAs, where a short duration high temperature step is used to electrically activate the Be followed by a longer low temperature anneal for lattice re-growth. PN diodes show a substantial reduction in reverse diode leakage current after the lower temperature second step anneal, when compared to a single step RTA or to furnace annealing (FA). For low energy Be implants, no difference in electrical activation between the single step and the two step anneal is observed. Raman studies demonstrate that residual substrate impurities and high Be concentrations inhibit restoration of single crystal lattice characteristics after RTA. Lattice quality is also shown not to limit diode characteristics in the RTA material.

3 Claims, 6 Drawing Sheets

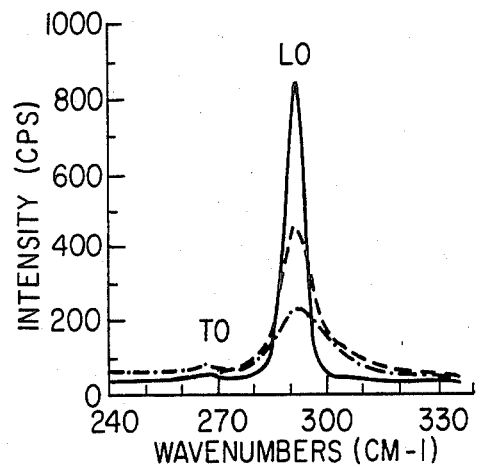
FIG. 5 RAMAN SPECTRA OF UNIMPLANTED UNANNEALED SUBSTRATE (—), Be IMPLANTED FA (---), AND Be IMPLANTED RTA (-·-) SAMPLES.
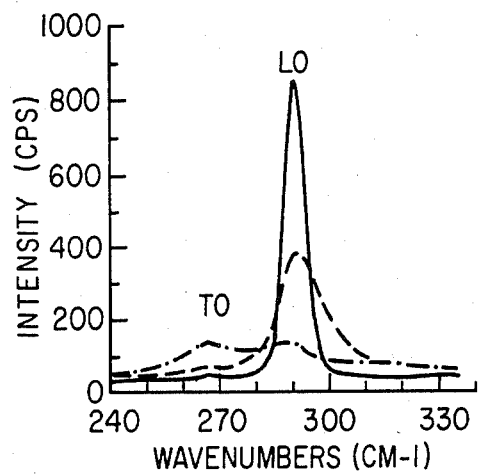
FIG. 6 RAMAN SPECTRA OF TWO STEP RTA SAMPLES FOR Be DOSES OF 5E12 cm-2 (—), 5E13 cm-2 (---), AND 5E14 cm-2 (-·-).
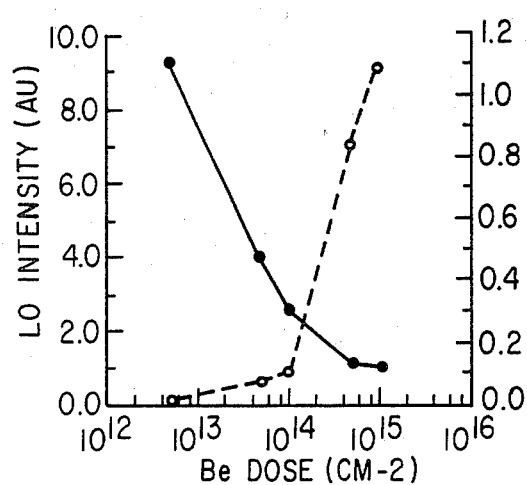
FIG. 7 LO INTENSITY (—) AND TO/LO INTENSITY RATIO (---) VERSUS DOSE FOR RTA SAMPLES.
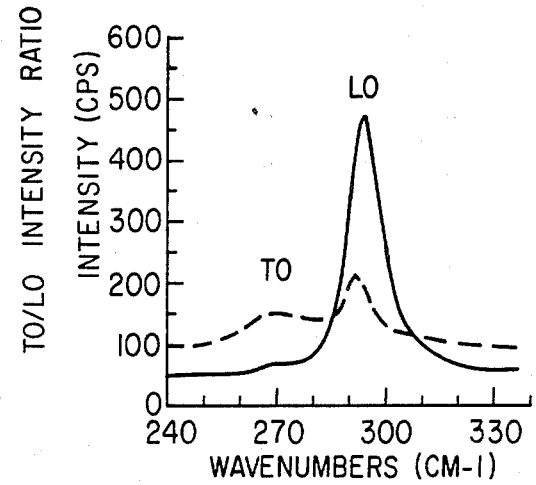
FIG. 8 RAMAN SPECTRA FOR UNDOPED (—) AND Cr-DOPED (---) SUBSTRATES Be IMPLANTED AT 5E13 cm-2 AFTER TWO STEP RTA.

4,743,569

TWO STEP RAPID THERMAL ANNEAL OF IMPLANTED COMPOUND SEMICONDUCTOR

BACKGROUND OF THE INVENTION

1. Field of the Invention.

The present invention relates to electronic semiconductor device fabrication, and, more particularly, to ion implantation annealling.

2. Description of the Related Art.

The fabrication of electronic semiconductor devices and integrated circuits requires the introduction of electrically active impurities (dopants) of various types into semiconductor material to provide needed varying electrical properties. Dopants can be introduced into semiconductor material by several methods: solid diffusion, ion implantation, alloying, and in situ doped semiconductor crystal growth. Currently, ion implantation is the most popular method for many applications.

Ion implantation is the injection of ionized-projectile atoms (dopants) into semiconductor material targets with enough energy to penetrate beyond surface regions. The most common application is the doping of silicon during device fabrication, and the depth of implantation is nearly proportional to the ion energy and can be selected to meet a particular application. Advantages of ion implantation include the avoidance of surface barriers that may affect diffusion doping and the capability to precisely control the number of implanted dopant atoms. See generally S.M.Sze Ed., VLSI Technology, ch.6 (McGraw-Hill 1983).

Ions entering a crystal at high energy undergo numerous scatterings, lose energy, and eventually come to rest in the crystal, but the scatterings displaces atoms in the crystal lattice and creates lattice damage. Various defects typically mark the track of an ion coming to rest in a crystal including vacancies and dislocations. Further, the implanted dopant ions usually do not end up on lattice sites and are not electrically active. Therefore the implanted crystal is annealed to eliminate lattice damage and to activate the implanted dopants by movement onto lattice sites. However, annealing implies diffusion of the implanted dopants, and it is a problem to anneal without significant diffusion.

The use of rapid thermal annealing (RTA) for implanted dopant activation allows fast turn around times with preservation of shallow diffusion profiles and good activation. The RTA of beryllium (Be) implanted into gallium arsenide (GaAs) has been used to make the p+ contact to the base of bipolar transistors (see P.Asbeck et al. 4 IEEE Elec.Dev.Lett. 81 (1983)) and to make p-i-n diodes (see K. Tabatabaie-Alavi et al., 43 Appl.-Phys.Lett. 647 (1983)). Additional characterization has been done on low energy implants where a lower activation than in high energy implants has been observed. See N. Barett et al, 35 Mat.Res.Soc. Symp.Proc. 451 (1985); also see P. Chambon et al, 46 Appl.Phys.Lett 162 (1985). This low activation in the near surface region should be minimized to insure good ohmic contact to a p+ implant region. One possible reason for a low near surface implant activation could be loss of Be to the surface. In furnace annealing Be out-diffusion has been observed for Be concentrations above $1 \times 10^{18}/cm^3$ and for temperatures at or above 800° C. See W. McLevige et al, 25 Solid State Comm. 1003 (1978) and 48 J.Appl.Phys. 3342 (1977).

The RTA process should be tailored to meet the specific activation implant requirements, whether to achieve high activation of a base region or to sacrifice the activation of the deep end of a p+ region to maximize the activation of the near surface p+ region. By examining both the RTA process and the furnace results, the RTA of p+ implant regions can be optimized. In furnace annealing, as the temperature is ramped up, crystalline recovery begins prior to the electrical activation of the Be implant; see P. Chambon et al 45 Appl.-Phys.Lett. 390 (1984). The 1985 Chambon reference has pointed out that the maximum implantation defect density should be preserved until the Be atoms move on to substitutional sites and become electrically active. Although a short time high temperature anneal is then optimum for activating the Be while minimizing redistribution, it may not remove all, or enough, of the crystal damage accumulated during the high dose ion implantation. It has been pointed out that for silicon implanted in GaAs that too high a pre-heat step with RTA reduces the activation; see the first Barett reference. Additionally, the Barett reference noted that for Be activation only a minimum dwell time at the anneal temperature is necessary, where increases in time or temperature resulted in only minimal improvement at best. But there is a problem in the known RTA methods for Be implanted into GaAs of dopant diffusion.

SUMMARY OF THE INVENTION

The present invention provides a rapid thermal anneal for Be implanted into GaAs that includes two steps: a short higher temperature step to activate the Be and a longer lower temperature step to eliminate crystal damage.

This solves the problem of the known beryllium implant annealing of dopant diffusion and profile degradation.

BRIEF DESCRIPTION OF THE DRAWINGS

The drawings are schematic for clarity.

FIG. 2 shows diode leakage currents of comparison tests;

FIGS. 5, 6, 8 show comparative Raman spectra;

FIG. 7 shows phonon intensity as a function of dose;

DESCRIPTION OF THE PREFERRED EMBODIMENTS

Figure 9:
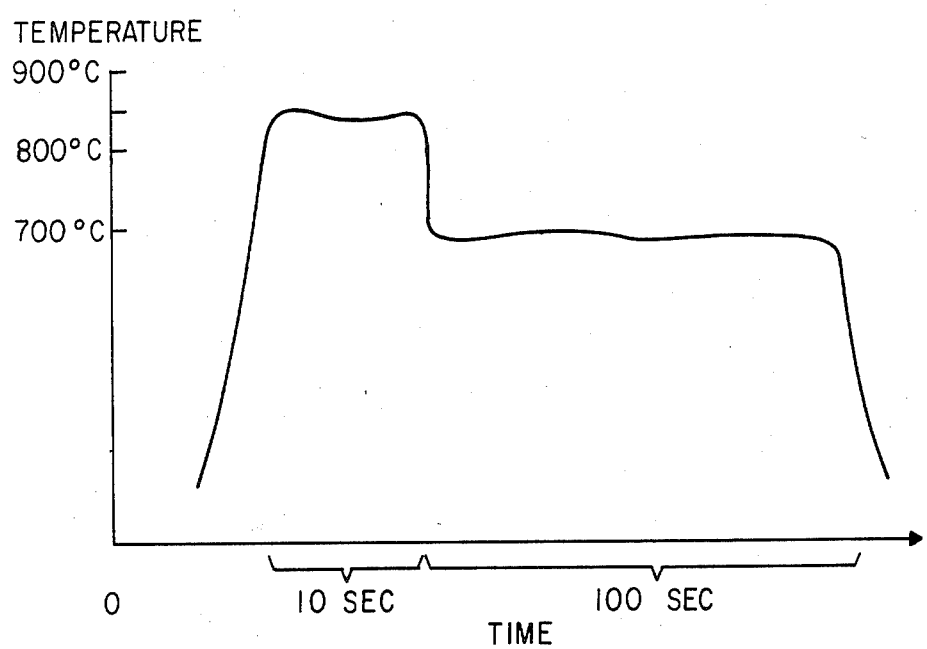
FIG. 9 illustrates a time/temperature profile.

The preferred embodiment rapid thermal annealing (RTA) methods for implanted Be activation in GaAs have a mimimum dwell time at peak temperature and an additional step to improve the crystallinity at a lower temperature; see FIG. 9 for a typical profile of temperature as a function of time. The first step need be only high enough to reach the electrical activation plateau, where only marginal improvements in activation are observed. The second step, since it is at a lower temperature should be for a longer time, provided that the temperature is below the regime of anomalous diffusion observed in furnace annealing which is about 800° C. The second step anneal could then be 700° C. Therefore, the preferred embodiments employ a two step RTA, where a short duration high temperature step is used to electrically activate the Be followed by a longer low temperature implant for lattice regrowth. The desired activation response differs for deep implants to fabricate diodes and for the shallow implants that would be used for ohmic contact formation.

Two different implant schedules were used to determine parameters. The first schedule had Be doses of $4 \times 10^{13}/cm^2$ and $4 \times 10^{14}/cm^2$ at 80 and 180 KeV into an n+ Si-doped GaAs substrate, these implants were used to form the p+ (about $1 \times 10^{19}/cm^3$) wells at 0.6 μm deep into the n+ substrates. These n+/p+ diodes provide a stringent test for leakage current reductions of the two-step annealing process. Diodes with areas of 75 μm by 75 μm were batch fabricated and tested on a 2 inch wafer. For diode formation, AuZn contacts were evaporated and alloyed on the p+ regions and AuGe/Ni was alloyed on the backside of the substrate. The second schedule had Be doses of $5 \times 10^{12}/cm^3$ to $1 \times 10^{15}/cm^3$ at 30 KeV into both un-doped and Cr-doped LEC GaAs wafers, these implants were primarily used for materials characterization. This low energy implant is a worst case test because of the near surface effect on the activation diffusion process. Comparisons can be readily made between the various techniques used for characterization.

The rapid thermal processing was done in a tungsten halogen lamp system (HeatPulse, manufactured by A. G. Associates). All RTA wafers were capped with PECVD deposited $Si_3N_4$, about 500 Å thick, and annealed in a forming gas (nitrogen plus 10% hydrogen) ambient with a temperature ramp rate of over 100° C./sec. The furnace annealed comparison slices were annealed using an arsenic over-pressure method for capless wafers at 850° C. for 5 minutes. Sheet measurements were made using a contactless probe, while Hall measurements were made using the standard van der Pauw method.

Raman scattering measurements of the transverse optical (TO) and longitudinal optical (LO) phonon energies and linewidths have also been used to characterize the regrowth process. Raman scattering allows the lattice damage to be monitored nondestructively as the samples are submitted to different anneal conditions. A comparison of Raman scattering measurement to conductivity probe and diode characteristics will be presented. Raman spectra were obtained on a series of <100> GaAs samples implanted with 30 keV Be. The measurements were made at room temperature in a near backscattering geometry using the 5145 Å line of an Ar laser. At this wavelength the laser 1/e penetration depth (approximately 1000 Å) is near the range of the Be implant. The spectra were taken unpolarized using approximately 70 mw of laser power focused cylindrically on the specimen. An instrument resolution of 5 $cm^{-1}$ and a sampling interval of 0.5 $cm^{-1}$ were used.

Figures 1, 2A, 2B, 2C:
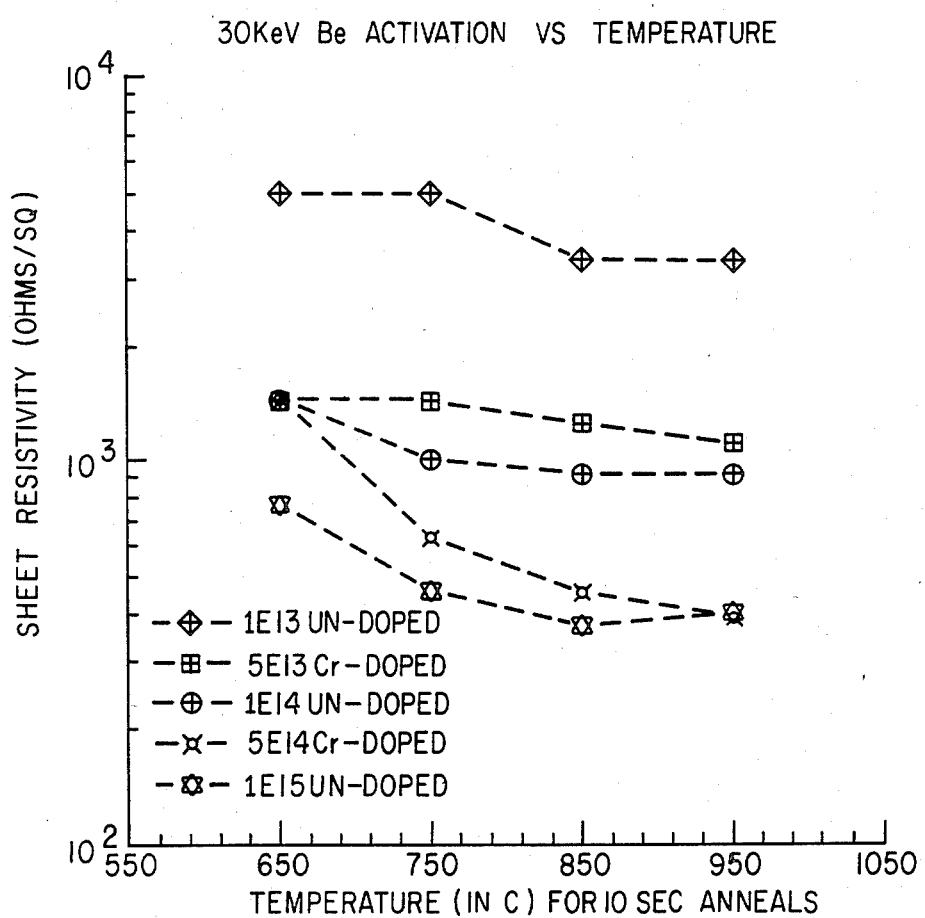
FIG. 1 illustrates the activation temperature plateau in terms of sheet resistivity.
Figure 10:
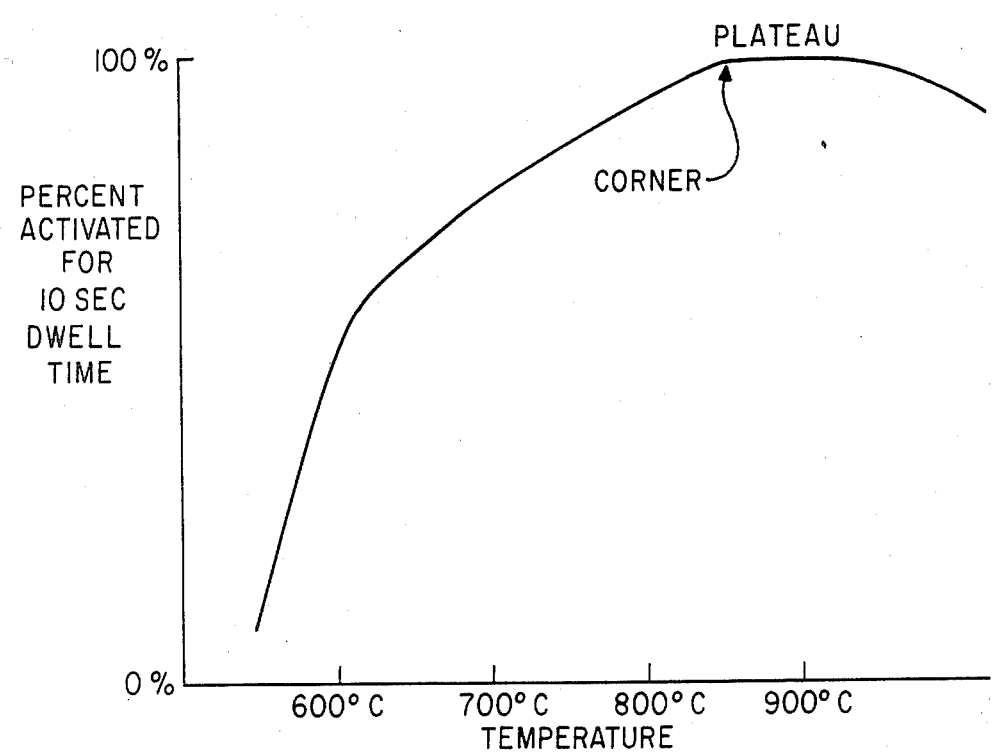
FIG. 10 shows the activation plateau.
Figure 11:
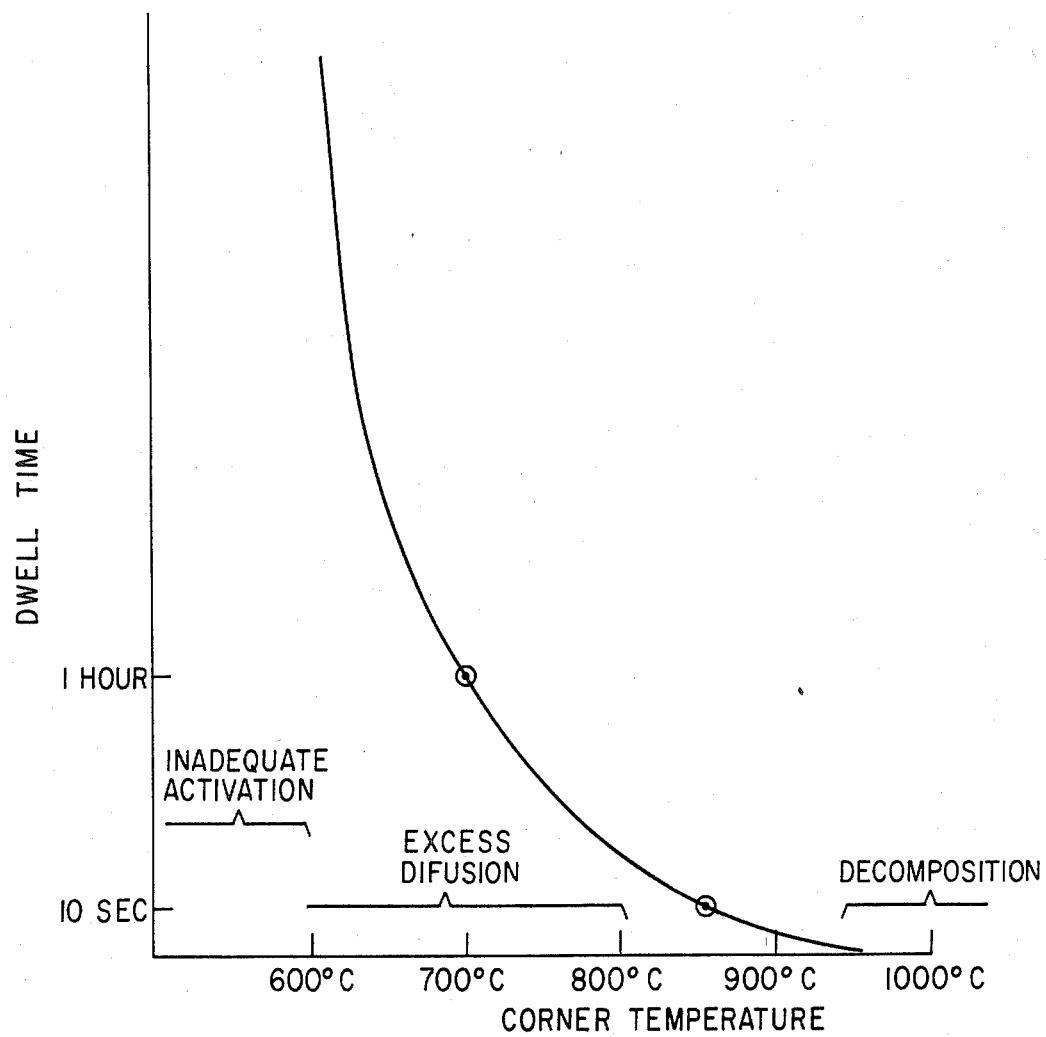
FIG. 11 illustrates the corner temperature dwell time relation.

The optimal, high temperature, primary anneal step of the two step process was determined by studying the activation versus temperature behavior of Be implanted over a range of doses. FIG. 1 shows a plot of sheet resistivity versus anneal temperature for one step anneals. The un-doped material shows a saturation in the curve around 850° C., where a further increase in temperature does not improve the sheet resistance. Clearly, the peak temperature should then be 850° C. which is the corner for the plateau region with a 10 second dwell time at the peak temperature (see FIG. 10) and should minimize diffusional spreading. If longer dwell times were used (such as 50 seconds), then the corner temperature would be lower, but the diffusion of the beryllium would greatly increase. Conversely, for shorter dwell times (such as 3 seconds) then the corner temperature will be higher, however, at such higher temperatures the GaAs surface may decompose resulting in out diffusion of gallium and beryllium into the cap layer. See FIG. 11 which schematically illustrates the dwell time/corner temperature correspondence and other limits.

The second step of the two step anneal is then set at a temperature below that at which anomalous diffusion occurs. A second step anneal of 700° C. would be well below the 800° C. temperature at which anomalous diffusion has been observed. The two-step anneal determined from this data is then 850° C. for 10 sec followed by a 700° C. second step anneal. Additionally, this plot does show a significant difference in the activation of un-doped GaAs versus Cr-doped GaAs. The Cr-doped material does not display a plateau effect up to 950° C., which perhaps indicates that Cr inhibits down the activation process.

The two-step anneal can then be compared to a single step anneal and to a standard furnace anneal by examining the results of diode reverse leakage currents as shown in FIG. 2. Leakage currents were measured at −8 V and plotted on the wafer map in units of μA. In FIG. 2a the furnace anneal results are presented, where approximately half the wafer has leakage currents above 2 μA which are distributed in a non-uniform fashion. Rapid thermal annealing cycles, however, have been found to yield lower leakage currents than furnace anneals. Wafers (B and C in FIG. 2) were first flash annealed at 850° C. for 10 sec. However, as shown in FIG. 2b, diode characteristics for a single 850° C., 10 second anneal are non-uniform. A second step RTA at 700° C., for 120 seconds on wafer C shows progressively smaller leakage currents and better uniformity which indicates an improvement in crystalline quality.

Figure 3:
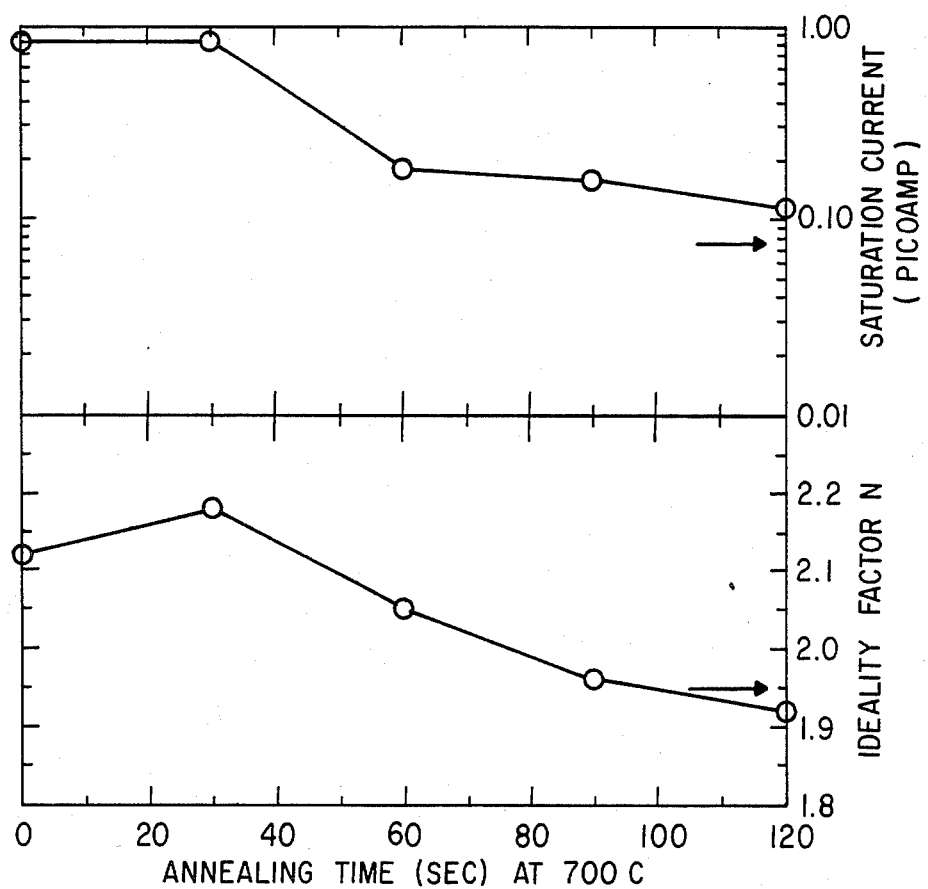
FIG. 3 shows the ideality factor of test diodes.

The improvement in leakage current, FIG. 3, is paralleled in the diode ideality factor, n, where n gradually decreases from n=2.1 for the single RTA step to 1.9 for the 120 sec second step RTA. Since a value of n equal to or greater than 2.0 is associated with high carrier recombination and high series resistance, a value of n=1.9 after the 120 sec annealing cycle is believed to be a direct result of reduced defect density. This data shows that the long time second step anneal results in significant improvement.

Figure 4:
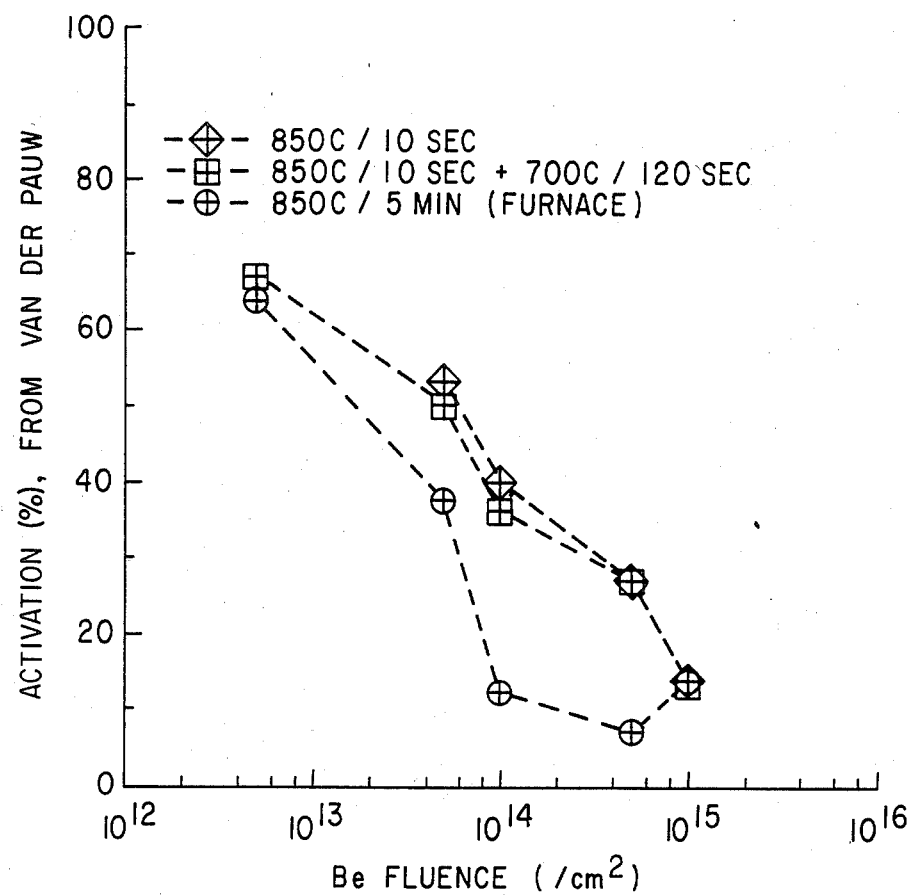
FIG. 4 shows percent activation as a function of dose.

This two step anneal process, 850° C./10 sec + 700° C./120 sec, can now be compared to a single step process and the furnace anneal by examining the low energy, 30 KeV, implants which are a worst case for activation. FIG. 4 shows the percent activation versus dose determined by Hall measurements. This figure illustrates the poor activation obtained for the low energy implants which decreases with increasing dose. There does not appear to be any significant difference between the one step and the two step anneals in terms of activation. Both RTA processes showed a large improvement over the furnace anneal results.

Three series of experiments were carried out using Raman spectroscopy to monitor the crystalline quality after solid phase epitaxial regrowth. The first experiment studied the effect of specific annealing conditions on regrowth. The second experiment studied the relationship between implant dose and residual damage following regrowth. Finally, the effect of substrate Cr doping on regrowth was investigated. For the analysis of the Raman spectra, the energy, intensity and linewidth of the first order LO and TO modes were extracted from the spectra. Decreases in LO intensity, increases in LO linewidth, and TO/LO ratio increases were used to meaure any degradation in lattice crystallinity (see P. Chambon et al, 46 Appl.Phys.Lett. 162 (1985); K. Tiong et al, 44 Appl.Phys.Lett. 122 (1984); and J. Diellman et al, 16 Solid State Phys. 1135 (1983)). The energy of the LO and TO modes were found to be relatively invariant between samples after annealing. Shown in FIG. 5 are comparative Raman spectra of an unimplanted unannealed sample, and two samples implanted with $1\times10^{14}/cm^2$ Be at 30 keV, one furnace annealed at 850° C. for 10 minutes and the other RTA at 850° C. for 10 sec followed by 700° C. for 120 sec. As evident from the LO intensity and LO linewidth for these samples, only partial crystal recovery results from either furnace annealing or rapid thermal annealing. Unimplanted RTA samples are indistinguishable in Raman from the pristine substrate. A higher degree of crystalline perfection is evident from the spectra for the furnace annealed specimen than for the RTA specimen. However since furnace annealing is known to result in re-distribution of Be at these doses, the poor crystal quality in the RTA samples, relative to the furnace annealed samples, may be a result of the lack of re-distribution in the RTA case. The broadening to the high wavenumber side of the LO feature in the implanted and annealed samples in FIG. 5 is due to the L+ collective mode resulting from the high hole concentration in these specimens. Representative Raman spectra showing the relationship between implant dose and crystal quality following two step RTA, 850° C. for 10 sec followed by 700° C. for 120 sec, is presented in FIG. 6. Crystalline quality following anneal degrades substantially with increasing dose. The intensity factors for the LO and TO modes versus dose are shown in FIG. 7. It is interesting that the forbidden TO band intensity becomes substantial at doses above $1\times10^{14}/cm^2$. FIG. 8 shows the regrowth behavior of undoped substrates compared to that of lightly Cr doped, $5\times10^{15}/cm^3$, substrates. For split lot experiments over a range of Be doses and RTA anneal conditions, Cr doped substrates always exhibit substantially larger TO/LO ratio than undoped substrates.

The Raman studies taken together indicate that impurities, be they residual to the substrate or intentionally implanted, strongly influence lattice regrowth during RTA. This is indicated by the inferior lattice quality in RTA relative to the conventional furnace annealing, by the inferior regrowth obtained for Cr doped substrates, and from the dose dependence of the intensity factors. From the Raman studies, the differences in diode characteristics with RTA conditions are not due to lattice improvements. Because of the high Be concentrations it is not surprising that the Hall and diode characteristics are not limited by lattice quality. More work is needed to understand the mechanism for the observed RTA improvements in diode characteristics.

MODIFICATIONS AND ADVANTAGES

Various modifications of the preferred embodiment devices and methods may be made while retaining the features of a two step rapid thermal anneal. For example, materials such as $Al_xGa_{1-x}As$, GaAs- on-silicon, and so forth would have similar behaviour. Also, small atoms such as magnesium should have properties similar to beryllium when implanted.

The invention provides the advantage of annealing implants in GaAs without significant dopant diffusion.

What is claimed is:

1. A method of doping compound semiconductor material, comprising the steps of:
   (a) implanting dopants into a semiconductor material body;
   (b) rapidly heating said body to a first temperature for a first time, said first temperature about the electrical activation corner temperature of said dopant in said semiconductor material for said first time; and
   (c) rapidly heating said body to a second temperature for a second time, said second temperature less than the minimum for significant diffusion of said dopant, and said second time sufficient to eliminate most defects created by said implanting.
2. The method of claim 1, wherein:
   (a) said semiconductor material is gallium arsenide;
   (b) said dopants are beryllium;
   (c) said first temperature is about 850° C.;
   (d) said first time is about 10 seconds;
3. The method of claim 2, wherein:
   (a) said second temperature is about 700° C.

* * * * *